United States Patent
Tomita

(10) Patent No.: US 7,277,324 B2
(45) Date of Patent: Oct. 2, 2007

(54) DRIVING METHOD OF NONVOLATILE MEMORY AND NONVOLATILE MEMORY USED IN THE SAME METHOD

(75) Inventor: Yasuhiro Tomita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/371,908

(22) Filed: Mar. 10, 2006

(65) Prior Publication Data

US 2006/0203560 A1    Sep. 14, 2006

(30) Foreign Application Priority Data

Mar. 10, 2005    (JP)    ............................ P2005-067966

(51) Int. Cl.
*G11C 16/00*    (2006.01)

(52) U.S. Cl. .............................. 365/185.16; 365/185.18

(58) Field of Classification Search ............ 365/185.16
See application file for complete search history.

(56) References Cited

U.S. PATENT DOCUMENTS

| | | | |
|---|---|---|---|
| 5,151,375 A | | 9/1992 | Kazerounian et al. |
| 5,204,835 A | | 4/1993 | Eitan |
| 5,768,192 A | | 6/1998 | Eitan |
| 5,900,661 A | * | 5/1999 | Sato ........................... 257/315 |
| 5,963,465 A | | 10/1999 | Eitan |
| 5,969,383 A | * | 10/1999 | Chang et al. ............... 257/316 |
| 6,011,725 A | * | 1/2000 | Eitan ..................... 365/185.33 |
| 6,134,165 A | | 10/2000 | Spence |
| 6,215,702 B1 | * | 4/2001 | Derhacobian et al. . 365/185.29 |
| 6,721,205 B2 | * | 4/2004 | Kobayashi et al. .... 365/185.26 |
| 6,906,959 B2 | * | 6/2005 | Randolph et al. ...... 365/185.29 |

FOREIGN PATENT DOCUMENTS

JP    2001-512290    8/2001

* cited by examiner

*Primary Examiner*—Tan T. Nguyen
(74) *Attorney, Agent, or Firm*—McDermott Will & Emery LLP

(57) ABSTRACT

To increase a cell current ratio of a program state to an erase state of two bit storage nonvolatile memory cells and reduce power consumption, a program state of MONOS-typed memory cells is a state where electrons are injected into two local regions near drain and source junction edges, an erase state is a state where the electrons injected into the two local regions are neutralized or holes are injected, and a read bias is a linear region. A cell current in the program state can be suppressed since charges injected into the source side suppress introduction of electron carriers required for formation of a conductive channel and charges injected into the drain side limit the formation of the conductive channel near the drain side. Accordingly, a read current can be reduced, a cell current ratio can be enhanced, and moreover, a margin of a reading operation can be increased.

10 Claims, 14 Drawing Sheets

$V_{gs} > V_{th}(s)$,
$V_{gs} > V_{th}(d) + V_{ds}$ $V_{gs} > V_{th}(s)$,
$V_{gs} > V_{th}(d) + V_{ds}$

SIMULTANEOUSLY ERASE BITS OF
DIFFUSION BIT LINE AT SOURCE SIDE

SECTIONAL LINE A-B

DRIVING METHOD OF NONVOLATILE MEMORY AND NONVOLATILE MEMORY USED IN THE SAME METHOD

BACKGROUND OF THE INVENTION

1. Field of the Invention

The present invention relates to a driving method of a nonvolatile memory and a nonvolatile memory used in the same method. More specifically, the present invention relates to a read and write system for storage of one bit of a two bit MONOS-typed memory cell and a nonvolatile memory employing the read and write system.

2. Description of the Related Art

Recently, as one kind of nonvolatile memory such as a flash memory or an EEPROM, which employs a floating gate system using a conductive material, such as polysilicon, as a material for storage of bit information, a MONOS-typed memory using an ONO film, as a composite film including silicon oxide (SiO) films and a nitrogen oxide (SiN) film, as an insulator, interposed therebetween, is being widely used to obtain better integration and reliability.

Such a MONO-typed memory has a virtual ground array configured with diffusion bit lines and word lines so as to obtain high integration, as shown in FIG. 14A. FIG. 14B shows a sectional view of a memory cell, taken along the line A-B in FIG. 14A. As shown in FIG. 14B, a transistor cell (typically, an Nch transistor) includes diffusion bit lines 34 below a LOCOS oxide film 33 as a drain D and a source S, respectively, and a word line 32 as a gate electrode, with an ONO film as a gate insulating film interposed between the bit lines 34 and the word line 32.

A program operation uses injection of hot electrons by a channel current flow between the drain and the source. The injected hot electrons are locally captured by a silicon nitride film of the ONO film at the vicinity of junction edges 36 of the diffusion bit lines 34, that is, in the vicinity of a junction at a drain electrode side at the time of programming.

Now, a read operation of the above-constructed memory cell will be described with reference to FIGS. 15A and 15B.

FIG. 15A shows an aspect of a conductive channel in an erase state of the memory cell. A cell current is read by applying a bias voltage to a saturated region. Since there exist no the injected hot electrons, an equivalent current flows for interchange between the drain D and the source S. The conductive channel at the drain electrode side is pinched off by an electric field of the drain D.

FIG. 15B shows an aspect of the conductive channel in a program state (a condition where charges are set in BIT1) of the memory cell. The memory cell is biased to the saturated region and hot electrons injected in the drain D are read by interchanging between the drain and the source for program.

Hot electrons injected in the source S suppress increase of a threshold value of the source S, that is, formation of the conductive channel, and lower the cell current, as compared to the erase state (no injected charge).

The hot electrons injected in the drain D have little effect on the cell current. This is because the saturated region must be deep as a read bias condition, the conductive channel in the vicinity of injected electrons at the drain D is not present by being pinched off, and the electrons flow as a punch-through between an edge of the conductive channel and the drain D.

Using such a characteristic, at least one bit is stored in each of the drain D and the source S, that is, the total of 2 bits can be stored in one memory cell.

An erase operation is performed by taking a gate voltage as a zero or negative voltage, applying a positive potential to one of a source junction and a drain junction, and using hole carriers initiated by a band-to-band tunneling effect at depletion region due to heavily doped (1E18 or so) impurity regions of the diffusion bit lines.

The hole carriers produced by the band-to-band tunneling effect are sufficiently accelerated by a lateral electric field applied between bit line junctions and a substrate and are injected as hot holes in the vicinity of the injected electrons of the ONO film, thus neutralizing the injected electrons.

If an electric field is simultaneously applied to the drain D and the source S, since the horizontal electric field important in generation of the hot holes is weakened, thus lowering efficiency of the erase operation, it is typically preferable to perform the erase operation for each diffusion bit line.

From the point of view of reliability, the MONOS-typed memory implements a high retention characteristic by local capture of electrons. In a memory cell employing the floating gate system having no local capture mechanism, injected electrons uniformly spread on a conductive floating gate surface. It is necessary to maintain an insulating property of the entire floating gate in order to maintain retentive property of electrons, and a leak at a local defect leads to fatal deterioration of the retention characteristic.

On the other hand, in the MONOS-typed memory, since the ONO film itself is a good insulator, there is no fatal detect even if a portion of the ONO film have any defect, as long as the portion is not a charge storage portion, thus allowing a very high tolerance to the defect.

The above-mentioned conventional two bit MONOS-typed memory is disclosed in (Device) JP-W-2001-512290, (Device) U.S. Pat. No. 5,768,192, (Device) U.S. Pat. No. 6,011,725, etc. In addition, a two bit MONOS-typed memory cell may have a virtual ground array structure with highly reduced area (5F2 or so) of a memory array by sharing the bit lines with adjacent tow bit MONOS-typed memory cells and making two bit MONOS-typed memory cells not to contact each other, as described earlier.

The virtual ground array has a very simple structure where the word lines 32 are perpendicular to the diffusion bit lines 34 embedded below the LOCOS oxide films 33, with the ONO film 31 as the gate insulating film, as shown in FIG. 14A. Such a basic architecture of the virtual ground array is disclosed in (Virtual ground array) U.S. Pat. No. 5,204,835 and (Virtual ground array) U.S. Pat. No. 5,151,375, and an architecture specialized by two bit read of the MONOS-typed memory cells is disclosed in (MONOS-typed virtual ground array) U.S. Pat. No. 5,963,465.

As one example of methods of reading memory data from the virtual ground array, there is a source side read method. In the source side read method, a reading operation is performed in a series of orders of discharge of the diffusion bit lines to ground, making impedance of the diffusion bit lines high, selection of accessing diffused bit lines, application of a read bias voltage (2 V or so) to drain side bit lines, connection of source lines to sense amplifiers, selection of a word line, etc. Details of the data reading method are disclosed in (Source side reading method) U.S. Pat. No. 6,134,165.

Now, problems of the above-described two bit MONOS-typed memory cell to be solved by the present invention will be described below. The two bit MONOS-typed memory cell is difficult to obtain a high threshold voltage Vth since a program state is realized only by charges locally injected into a local source electrode side, and requires a relatively high drain bias for two bit separation.

Accordingly, since a cell current ratio of the program state to the erase state is small at the end of life, for example, 1:2, and a large difference (margin) between a cell current and a reference cell current or between a cell voltage and a reference voltage can not be taken, it is difficult to perform a high speed reading operation with high reliability.

The reading operation with high reliability as used herein means that the difference between the cell current and the reference cell current or between the cell voltage and the reference voltage is sufficiently large, even though the cell current is varied due to possible deterioration of memory cells, and sense amplifiers can correctly read logical bit values stored in memory cells. In addition, for a two bit separation reading operation, there is a need to pinch off a conductive channel at an area near a drain of a memory cell with a drain voltage of the memory cell being at least more than a saturated voltage. The drain voltage of the memory cell is typically higher than that of a floating gate-typed memory cell. Moreover, there may occur a disturbance of storage data due to a soft program effect of the reading (an effect that data are weakly written into erased cells due to not electron injection at a low electric field in the reading operation).

In addition, the two bit MONOS-typed memory cell has greater power consumption than that of the floating gate-typed memory cell. More specifically, the two bit MONOS-typed memory cell has a problem in that it has great power consumption due to a high drain bias voltage for a cell of an erase state and due to a high leak current and a high drain bias voltage for a cell of a program state.

Next, problems of the above-described virtual ground array to be solved by the present invention will be described below. For the virtual ground array, the reading operation of the cell current is performed by first discharging the entire bit lines (drains and sources) to a ground potential before a memory cell is selected, and then putting the discharged entire bit lines into a high impedance state. A cell current of a desired cell is read by applying a gate bias voltage to a word line, applying a drain voltage (1~2 V) at the Lime of reading to a drain, and connecting source potential side bit lines to sense amplifiers.

The diffused bit lines at the source side are shared with adjacent cells. Accordingly, the cell current is leaked into the adjacent cells depending on a program state, i.e., impedance, of the adjacent cells in a word line direction of the source side. When the adjacent cells are in an erase state, the cell current is leaked into the adjacent cells, and the sense amplifiers determine that a cell current input thereto is smaller than that of an actual cell current.

Such a phenomenon causes erroneous determination (determining that writing of data into a cell further requiring a program pulse is completed) of a verification operation (measuring a cell current or a threshold value after application of a program pulse, and verifying whether or not further pulses are required) in a cell program operation.

The amount of leak of the cell current into the adjacent cells is affected by the program state of a cell group connected to the word lines of the source side. On this account, distribution of current of programmed cells, being affected by a cell current depending on deviation of physical write characteristics of a memory, a memory array structure and written data, becomes wide.

Accordingly, since the charge state distribution of the memory cell is wide, a margin of conditions must be considered to guarantee the reliability, and a margin required as a bias condition for reading becomes large, which results in insufficient use of characteristics of the memory cell.

To avoid this, typically, time for writing must be increased, such as reading in advance information of adjacent bits of cells to be programmed, applying further pulses when adjacent bits of the source side are in the erase state, and adjusting a determination level of program verification, thus requiring sacrifice of performance of the memory cells to some degree. An effect that a cell current to be read is varied depending on the program state of the adjacent cells is a problem to be solved for a reading margin and reliability of the virtual ground array.

SUMMARY OF THE INVENTION

The present invention has been made to overcome the above problems, and it is an object of the present invention to provide a driving method of a nonvolatile memory having a high dynamic range of a cell current with low power consumption.

In addition, it is another object of the present invention to provide a nonvolatile memory having a high dynamic range of a cell current with low power consumption.

In order to achieve the above-mentioned objects, the present invention provides means for solving the problem of the two bit MONOS-typed memory cell.

A cell current in a program state must be further reduced in order to spread a dynamic range. A drain voltage at the time of reading is lowered to at least a potential at which charges locally injected into an ONO film near a drain edge start to have an effect on a cell current. This indicates that a conductive channel is formed immediately below the locally-injected charges, that is, a bias condition of the memory cell is a linear condition.

In a driving method of a nonvolatile memory of the present invention, a program state of MONOS-typed memory cells is a state where electrons are injected into two local regions of an ONO film near drain or source junction edge, an erase state is a state where the electrons injected into the two local regions of the ONO film near the drain or source junction edge are neutralized or holes are injected, and a cell current is biased to a linear region and is read (that is, Vgs>Vth(s) and Vgs>Vds+Vth(d) (where, Vth(s) is a threshold value at a source side, and Vth(d) is a threshold value at a drain side)). The memory cell acts as a one bit storage cell with low power consumption and a large dynamic range of the cell current.

According to a nonvolatile memory of the present invention, by fixing a one bit storage cell region and a two bit storage cell region, setting of a read condition and change of an address space become possible at the same time of address input, thus enabling a high-speed operation of the one bit storage cell region.

According to a nonvolatile memory of the present invention, a two bit storage cell region in which two bits are stored, and a one bit storage cell region to which a read and write method is applied set to any size and any position, and a single memory array can be used with an optimal condition set depending on required capacity, reliability, speed and power, thus meeting a need for more applications.

According to a nonvolatile memory of the present invention, by changing a read timing of a sense amplifier and a reference current, in addition to a bias condition of cell, depending on a read region of a one bit storage cell region and a two bit storage cell region, a condition for the sense amplifier in the one bit storage cell region is optimized.

According to a nonvolatile memory of the present invention, by using a flag region for determining a read region of the one bit storage cell region and the two bit storage cell region, a user does not need to know whether the memory array is the one bit storage cell region or the two bit storage cell region, or to know information other than information on the memory cell.

According to a nonvolatile memory of the present invention, a flag region for determining a read region of the one bit storage cell region and the two bit storage cell region is read in advance into an external register, thus providing a high-speed operation close to region fixation.

According to a nonvolatile memory of the present invention, a one bit storage cell region, a two bit storage cell region, and a flag region are set in the unit of word line, thus facilitating to specify the number of bits in a storage region. In addition, since a word line bias in a word line can be fixed, the word line can be switched at a high speed.

According to a nonvolatile memory of the present invention, a one bit storage cell region is a high-speed read region having a sense amplifier operation completion timing earlier than that of a two bit storage cell region.

According to a nonvolatile memory of the present invention, by setting a one bit storage cell region as a region to be read immediately after power up, data can be more reliably read even at an unstable read voltage at the time of power up, and trimming information of a reference power source can be effectively read.

In order to achieve the above-mentioned objects, the present invention further provides means for solving the problem of the virtual ground-typed memory array.

According to a nonvolatile memory of the present invention, in the virtual ground-typed memory array, a program state is a state where electrons are injected into a source side, an erase state is a state where drain and source-injection electrons are neutralized or holes are injected, and diffusion bit lines of the virtual ground-typed memory array are fixed at the drain or the source. Accordingly, hot hole injection for erase align adjacent cells at the source side to enable an erase operation.

According to a driving method of a nonvolatile memory of the present invention, a program state of the MONOS-typed memory cells is a state where electrons are injected into both drain and source sides, an erase state is a state where electrons are injected into the drain side and electrons injected into the source side are neutralized or holes are injected, and a cell current is biased to a saturated region and is read (that is, Vgs>Vth(s) and Vgs>Vds+Vth(d) (where, Vth(s) is a threshold value at the source side, and Vth(d) is a threshold value at the drain side)). The memory cell acts as a one bit storage cell with a drain and a source interchanged.

According to a nonvolatile memory of the present invention, in the virtual ground-typed memory array, a program state is a state where electrons are injected into both the drain and source sides, an erase state is a state where electrons are injected into the drain side and electrons injected into the source side are neutralized or holes are injected, and diffusion bit lines of the virtual ground-typed memory array are fixed at the drain or the source. Accordingly, when a diffusion diffusion bit line at the drain side has a source potential at the time of program, a cell current can be cut off, thus preventing loss of the cell current due to float of the source potential at the time of reading.

According to a nonvolatile memory of the present invention, in the virtual ground-typed memory array, a program state is a state where electrons are injected into both the drain and source sides, an erase state is a state where electrons are injected into the drain side and electrons injected into the source side are neutralized or holes are injected, diffusion bit lines of the virtual ground-typed memory array are fixed at the drain or the source. Accordingly, the electron injection at the drain side aligns adjacent cells from only the drain to enable a program operation.

The nonvolatile memory of the present invention shows the following effects.

Regarding a twin program cell system, a cell current ratio of the program state to the erase state, that is, the dynamic range of the memory cell current, can be large.

In addition, a large margin for a reference current or potential in a read operation can be taken, and accordingly, tolerance to erroneous read due to variation of a cell current or change of the cell current with time is high and the reading with higher reliability can be realized.

In addition, reading completion time can be further reduced by using increase of the dynamic range of the memory cell, thus realizing a higher speed operation. In addition, the cell current in the program state can be reduced, thus consuming lower current for the reading operation.

In addition, since program data are maintained in two local regions, the number of electrons is double the conventional number of electrons, thus giving more reliability for retention. In addition, since both program and erase states can work with interchange of the drain and the source, a degree of freedom for an array decoder design is high.

In regards to a mixture of the twin program cell and the two bit cell, by using a region flag, a single memory array can be used with an optimal condition set depending on required capacity, reliability, speed and power. That is, the single memory array can meet a need for more applications.

Data can be more reliably read even at an unstable read voltage at the time of power up, and accordingly, trimming information of a reference power source can be effectively read. Conventional trimming information is processed by majority using a plurality of bits. Reduction of the plurality of bits becomes possible.

By fixing the one bit storage cell region and the two bit storage cell region, setting of a read condition and change of an address space become possible at the same time of address input, thus enabling a high-speed operation.

By reading a flag region in advance into an external register, a high-speed operation close to region fixation is possible.

Regarding an erase method, in the case of the one bit cell, two bits per one word line and one bit line can be simultaneously erased, thus reducing erase time. In addition, if an erase current per one diffusion bit line is greatly limited, the length of the diffusion bit line (the number of cells to be simultaneously erased) can be reduced. However, it should be noted that a conventional erase operation may be preferable.

Regarding a single erase method, in the virtual ground memory array, when the memory cell current is read from the source side, a read cell current to a source side adjacent cell side can be excluded, thus enhancing precision of a verification operation for erase and realizing steep memory cell current distribution (Vth distribution). In addition, a large read margin can be obtained.

In the erase operation, due to hole injection from only a source side, two bits per one word line and one bit line can be simultaneously erased, thus reducing erase time.

Without changing a read timing and a bias condition, a switching can be made between one bit operation and two bit operation only by fixation at the drain side or a program switching.

A high speed program can be realized by performing parallel writing of at least two bits per one word line and one bit line for fixed bits at the drain side. The fixed bits at the drain side need not to be erased, and accordingly, an overwriting state can be obtained. Precision of an internal power source is not required for writing of the fixed bits at the drain side, thus enabling writing by a simple external power source. The writing by the external power source lessens a limitation on the number of bits to be simultaneously written by the current capacity, thus enhancing a writing through-put of the fixed bits at the drain side. A writing disturbance by soft write has little effect on the writing operation since the writing operation is the writing of the fixed bits at the drain side.

DESCRIPTION OF THE PREFERRED EMBODIMENTS

First Embodiment

Figure 1:
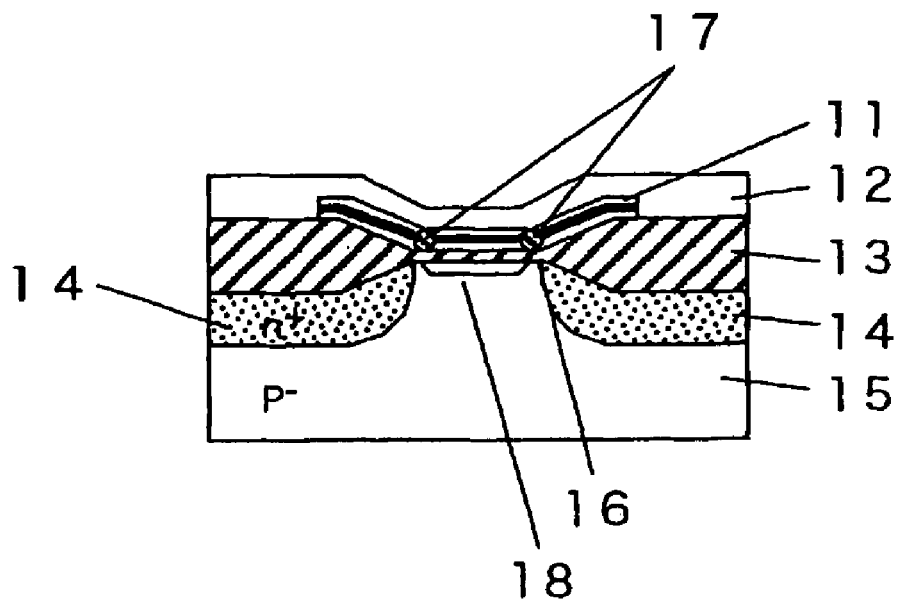
FIGS. 1A and 1B are sectional views of a MONOS-typed memory cell according to a driving method of a nonvolatile memory, according to an embodiment of the present invention.
Figure 1:
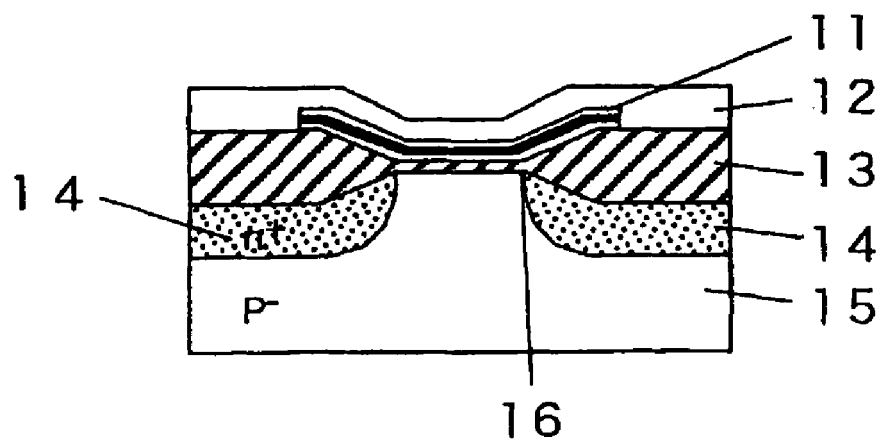

Hereinafter, exemplary embodiments of the present invention will be described with reference to the accompanying drawings. FIGS. 1A and 1B are sectional views of a MONOS-typed memory cell schematically showing injected charges in a driving method of a nonvolatile memory, according to an embodiment of the present invention.

FIG. 1A is a sectional view showing a program state of a nonvolatile memory cell according to an embodiment of the present invention. As shown in the figure, two LOCOS films 13 are formed as field oxide films on a P-type silicon substrate 15. N+impurity-diffusion bit lines 14 are formed below the LOCOS films 13. An area between drain and source junction edges 16 becomes an area in which a conductive channel 18 of a transistor is to be formed. A word line 12 made of polysilicon or polycide and having an ONO film 11 as an insulator contacts a channel region. The word line 12 having the ONO film 11 as the insulator acts as a typical transistor. In a program state, charges are locally injected into the ONO film 11 near the two drain and source junction edges 16 of the diffusion bit lines. The injected charges are hot electrons by a channel current flowing between the diffusion bit lines 14. A profile of the injected charges by the hot electrons is very steep with a spread width of 10 nm to prevent the injected electrons 17 from being spread into the channel region.

FIG. 1B is a sectional view of the memory cell in an erase state. As shown in the figure, the injected electrons 17 at two spots are neutralized and erased by injected hot holes. A process of generating the hot holes is as follows. The diffusion bit lines ($N^+$) are depleted to generate hole carriers by a band-to-band tunneling effect. Energy of the hole carriers immediately after being generated is too low to jump potential barriers of Si of a substrate and $SiO_2$ as a bottom oxide film of the ONO film, which does not contribute to injection of holes into the ONO film.

The generated holes become hot holes by being accelerated by a traverse electric field due to a reverse bias of the silicon substrate 15 and the diffusion bit lines. The hot holes jump the Si and $SiO_2$ potential barriers to be injected into the ONO film 11 and accordingly neutralize the injected charges 17.

When a peak position of the amount of capture of hot holes in the ONO film is equal to a peak position of the amount of capture of hot electrons in the ONO film, highest writing and erase efficiency may be attained. However, since these peak positions depend on an impurity profile of the diffusion bit lines and have different physical generation mechanisms, a condition where both peak positions are equal to each other is extremely limitative, and generally, it is not possible to obtain such a condition. However, since holes have mobility larger than that of electrons in a nitride film, a slight difference between both peak positions makes little matter.

Figure 2:
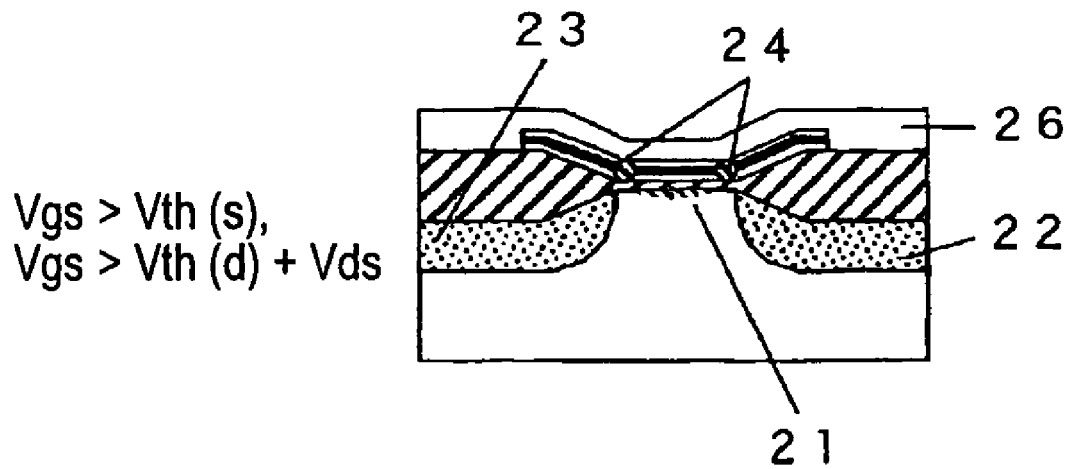
FIGS. 2A and 2B are sectional views used to explain a reading operation of a MONOS-typed memory cell according to a driving method of a nonvolatile memory, according to an embodiment of the present invention.
Figure 2:
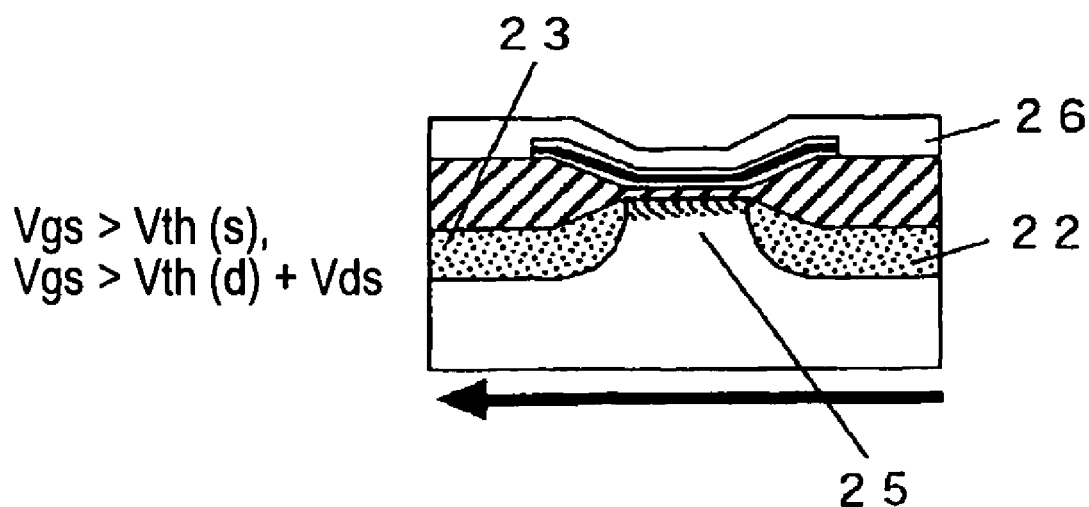

Now, a reading operation of the memory cell will be described with reference to FIGS. 2A and 2B. FIG. 2B is a sectional view of a memory cell schematically showing a conductive channel in a reading operation in an erase state. The memory cell is biased to be in a linear region, that is, to have a relation of Vgs>Vth(s) and Vgs>Vth(d)+Vds (where, Vth(s) is a threshold value when viewed from a source 23, and Vth(d) is a threshold value when viewed from a drain 22), and then is read.

A conductive channel 25 is continuously formed over a range from the source 23 to the drain 22. Although a thickness of a drain side becomes even thin due to a drain potential (in the present invention, the term 'thickness' is used to visually express an aspect of the conductive channel although an expression that carrier concentration is low is more correct that the term 'thickness' is since the channel itself is very thin on an order of several nm), there occur no pinch-off effect (an effect that the channel becomes thin and cut).

FIG. 2A is a sectional view of a memory cell schematically showing a conductive channel in a reading operation in a program state. Although the memory cell is in the linear region, a conductive channel 21 below the injected electrons 24 is not nearly formed due to the influence of an electric field of the injected electrons 24. The injected electrons 24 at the source 23 suppress introduction of electrons from the source 23, which is required to form the conductive channel 21, and the injected electrons 24 at the drain 24 suppress formation of the conductive channel 21 to the drain 22. Since a current in the program state can effectively utilize even the injected charges at the drain, which have been invalid in a conventional reading operation in a saturated region, a read current at the time of programming can be suppressed to be further small as compared to the saturated region. That is, the cell current in the program state, which is a conventional problem, can be further reduced, thus allowing spread of a dynamic range as a cell current ratio of the program state to the erase state.

In a driving method of the nonvolatile memory using the MONOS-typed memory cells of the present invention, since the injected charges at the drain make a drain current controllable or there is no need of two bit separation, a drain voltage at the time of reading is not required to pinch off the conductive channel. Accordingly, a reading operation can be achieved with a low drain voltage and reduced power consumption at the time of programming, as compared to a conventional two bit reading method. The drain voltage can be lowered up to a potential at which the charges locally injected into the ONO film near at least a drain edge start to have an effect on the cell current.

Second Embodiment

Next, an embodiment of a reading method of a memory device where the above-described one bit storage and the conventional two bit storage are mixed will be described with reference to relevant figures.

Figure 4:
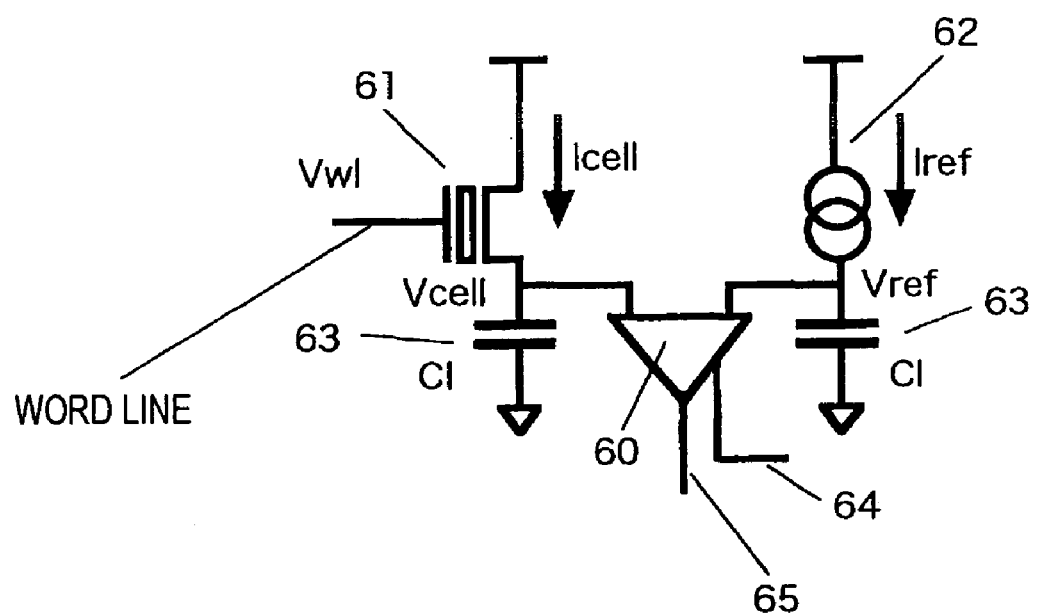
FIG. 4 is an equivalent circuit of a sense amplifier system used to explain operation of a nonvolatile memory according to an embodiment of the present invention.

FIG. 4 is an equivalent circuit of a sense amplifier system used to explain the embodiment of the present invention.

A memory cell current Icell of a memory cell 61 and a current Iref of a reference current source 62 are integrated by respective bit line load capacitors 63, compared by a sense amplifier 60 as bit line voltages Vcell and Vref, respectively, and read from output 65 of the sense amplifier 60. A time at which the integration of the currents Icell and Iref is completed and the output 65 of the sense amplifier 60 is latched is specified as a sense latch timing 64.

Figure 5:
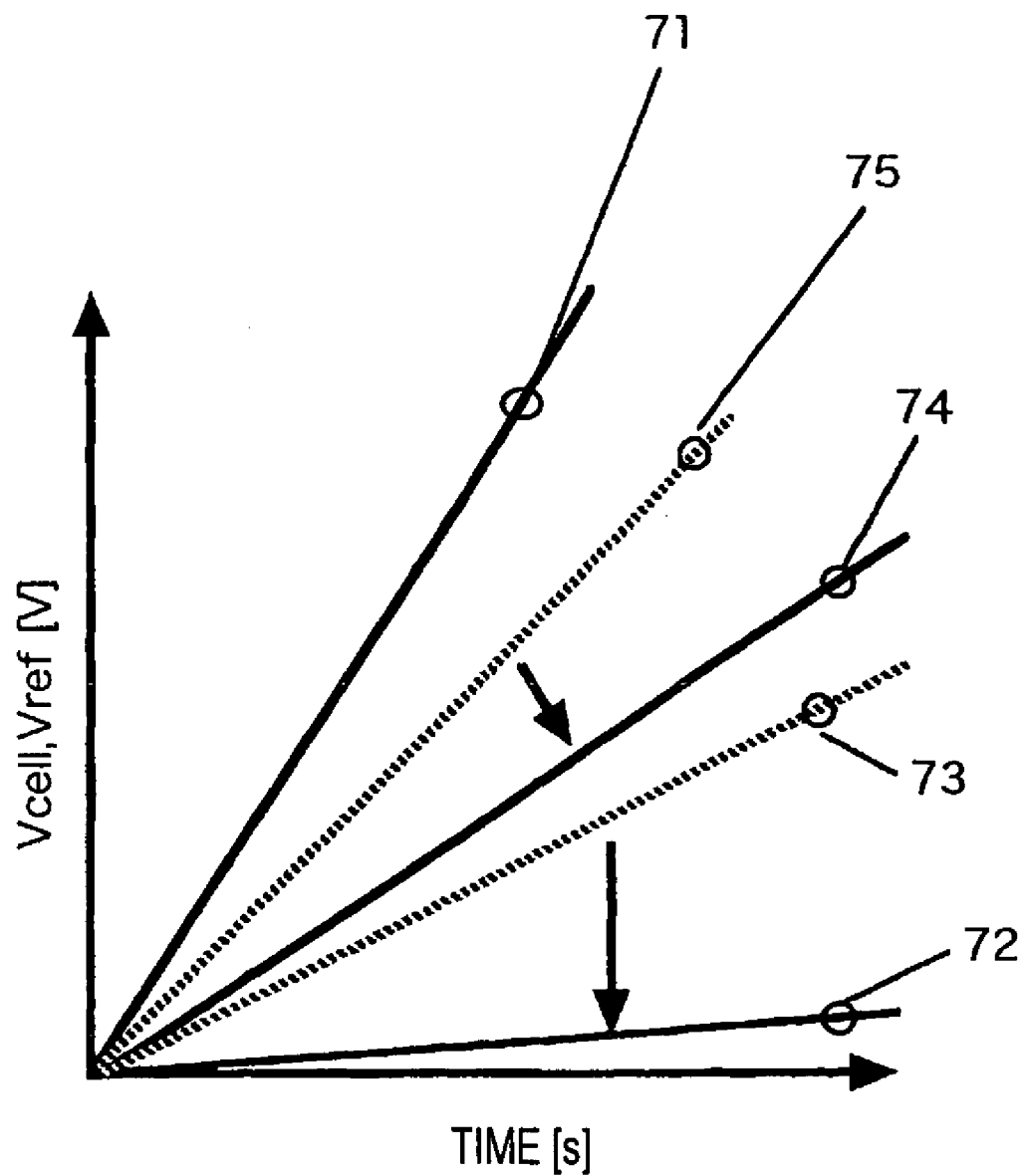
FIG. 5 is an explanatory view illustrating change of Vcell and Vref with time for explanation of operation of a nonvolatile memory according to an embodiment of the present invention.

FIG. 5 is an explanatory view illustrating change of Vcell and Vref with time, while comparing a cell in a one bit storage region with a cell in a two bit storage region. The cell currents in the erase state are adjusted to have the same value for both of the one bit and two bit storage regions by adjusting a word line voltage Vwl. In general, a reference voltage is an addition of a margin voltage, which is vertically symmetrical with respect to the reference voltage, including a gain of a sense amplifier, noise of a power supply system, deviations of transistors, a power source voltage, and variation of temperature, to a change of the cell current (in program and erase states) with time (in the case of the nonvolatile memory, a change of a current characteristic due to loss of injected charges or a gain). In general, the change of the cell current with time is asymmetrical due to a difference of the change of the cell current between the program state and the erase state. However, a circuital operation at the highest speed may be achieved by granting a symmetrical margin. In general, a margin is set to make initial values symmetrical, rather than granting an asymmetrical margin in an initial state and making the asymmetrical margin symmetrical in an end off life.

A reference 74 of the one bit storage region is set in the middle of an erase state 71 and a program state 72 of the one bit storage region. By setting the reference 74 at an intermediate voltage, an input margin to the sense amplifier to determine whether the memory cell is in the erase state or the program state is always well-balanced even if the sense latch timing 64 is dispersed, thus allowing maximum utilization of the margin. When the margin is unbalanced, the margin has a margin value of a system with a smaller margin.

In the case of a margin of the two bit storage region, when a current in the erase state is aligned to the erase state 71 of the one bit storage region by adjusting Vwl, since a program state 73 of the two bit storage region is even larger than the program state 72 of the one bit storage region, a reference 75 is set to be a large current value.

With this configuration, the one bit storage region can always assume a large input margin of the sense amplifier. This allows a reading operation with high reliability as reading in the one bit storage region at the same sense latch timing 64 is robust to variation of the cell current, noises, or deterioration of the memory cell.

In addition, when input margins of sense amplifiers are the same value, the one bit storage region can fix the sense latch timing early, thus allowing a high-speed operation.

In addition, the one bit storage region can set a reference cell current small. This contributes to low power consumption as well as reduction of the cell current in the program state. In addition, this is very important in reading of multi-bit and setting a reference cell for each sense amplifier.

The above-described configuration of the reading operation according to this embodiment has a characteristic of the reduction of the reference cell current and a selective earl timing setting of the sense amplifier.

Third Embodiment

Figure 3:
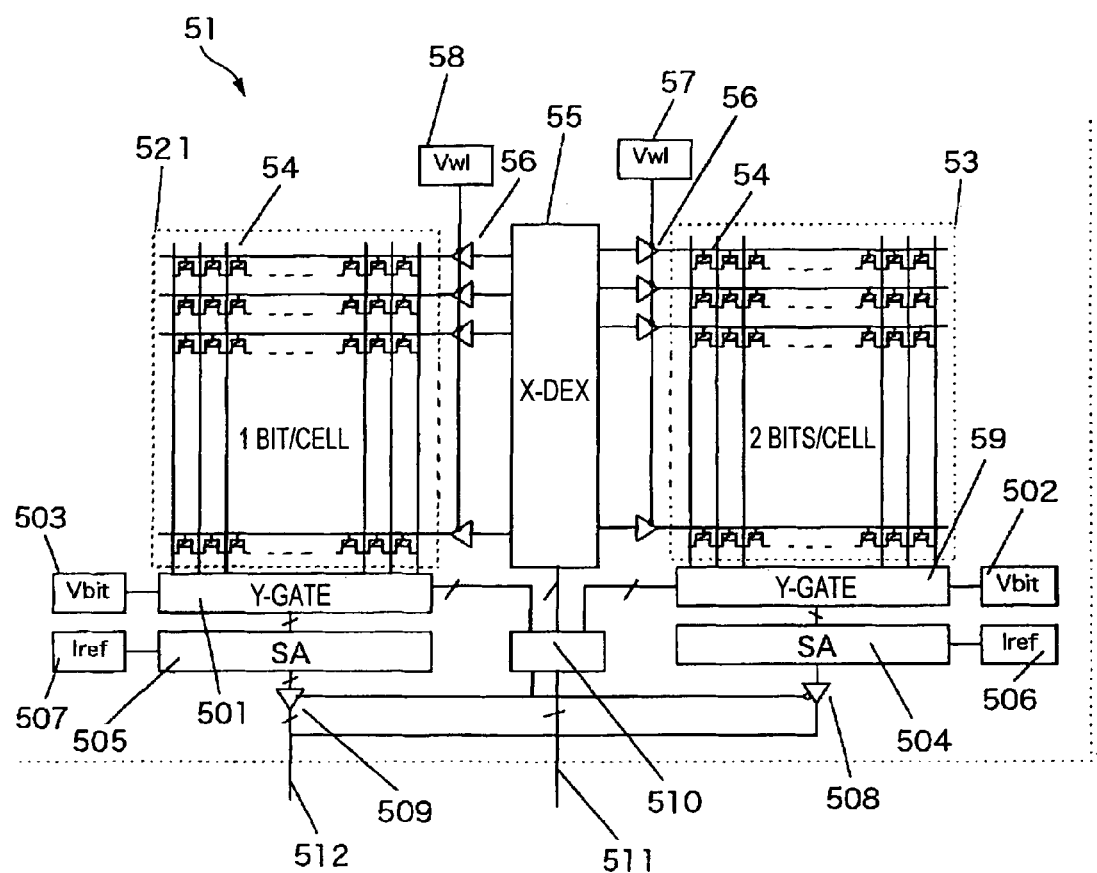
FIG. 3 is a block diagram of a nonvolatile memory with a one bit storage region and a two bit storage region fixed for high-speed, according to an embodiment of the present invention.

Next, an embodiment of a memory device where the above-described one bit storage region and the conventional two bit storage region are mixed will be described with reference to a relevant figure. FIG. 3 is a block diagram of a nonvolatile memory with the one bit storage region and the two bit storage region fixed for high-speed, according to an embodiment of the present invention.

A nonvolatile memory 51 includes a one bit storage region memory array 52 as the one bit storage region accessed according to the above-described driving method and a two bit storage region memory array 53 as the two bit storage region accessed according to the above-described driving method, both of which are separated from each other and are connected to an X decoder 55 in common.

The X decoder 55 has separate word line power sources 57 and 58 for respective storage regions. Regarding a column system, Y gates 59 and 501 and sense amplifiers 504 and 505 have bit line power sources 502 and 503 for generating separate bit line bias voltages (drain bias voltages) for each storage region and reference current sources 506 and 507, respectively.

An output buffer of the two bit storage region or an output buffer 509 of the one bit storage region is selected by an address input to an address input 511, and then, data are read from a data output 512.

With this configuration, with the X decoder in common, which is capable of coping with two output levels, a decoder of low power consumption and low area may be attained. In addition, by placing one bit and two bit read regions of a hard-fixed size (capacity of a fixed bank) in a fix position (a bank address), bias power sources or the like required for one bit and two bit reading are operated independently. Accordingly, set-up of power sources and so on, required for switching of the one bit and two bit reading, is not needed at all, and a highest-speed configuration can be achieved when the one bit and two bit storage regions are mixed. By slightly scarifying a read margin of the sense amplifiers, the reference current sources 506 and 507 can be put in common, and accordingly, a nonvolatile memory with low power consumption and low area can be attained.

Fourth Embodiment

Figure 6:
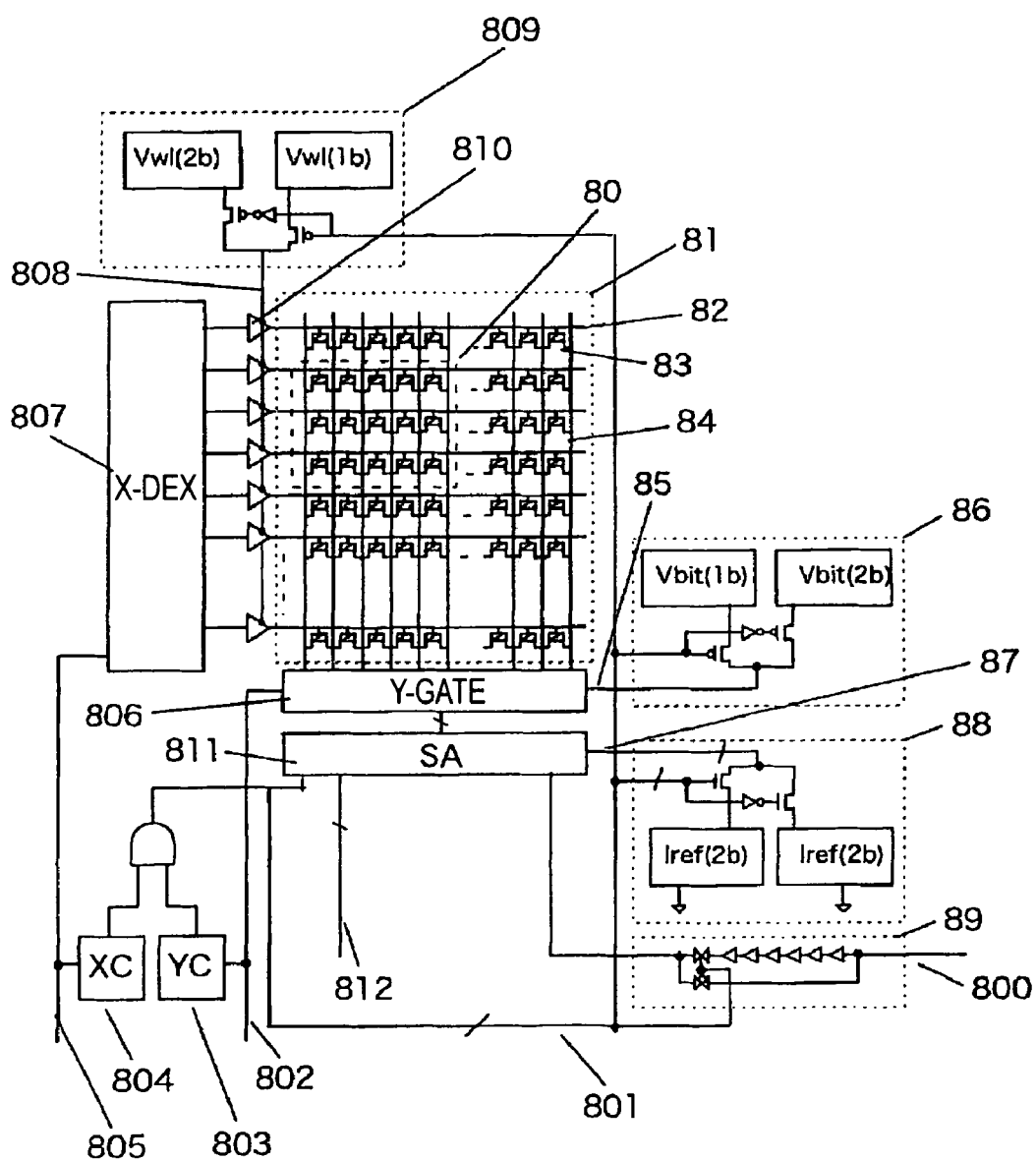
FIG. 6 is a block diagram of a nonvolatile memory having a one bit storage region and a two bit storage region, which can be set to be a rectangular area, according to an embodiment of the present invention.

FIG. 6 is a block diagram of a nonvolatile memory having the one bit storage region and the two bit storage region, which can be set to be a rectangular area, according to the embodiment of the present invention.

In the nonvolatile memory, a two bit storage region memory array 80 is set in a rectangular region within a one bit storage region memory array 81.

An access to memory cells is specified by an X address 805 and a Y address 802.

The X address 805 is input to an X decoder 807 and drives a word line selected and specified through a word line driver 810. A word line driving voltage is produced by controlling a word line voltage 808 as an output of a word line voltage switching circuit 809.

The Y address 802 selects a Y gate 806 and connects bit lines 84 to a sense amplifier 811. A bias voltage of a bit line is input from a bit line voltage switching circuit 86 to a bit line voltage input 85. A reference current from a reference current switching circuit 88 is applied to a reference current input 87 of the sense amplifier 811. In addition, the sense amplifier 811 is input with a sense timing 800 specifying integral time of a cell current via sense timing switching circuit 89.

Hereinafter, a mechanism for selecting the two bit storage region memory array 80 as the rectangular region will be described. An address region (range) of the word lines and an address region (range) of the bit lines, both of which are the two bit storage region, are stored in advance in built-in registers of an X address comparator 804 and a Y address comparator 803, respectively.

The built-in registers may be nonvolatile or volatile. In the case of the nonvolatile built-in registers, data are written into them at the same time of writing the data into the nonvolatile memory. In the case of the volatile built-in registers, data are downloaded from an external hardware into the volatile built-in registers, or data are stored in a specific region of the nonvolatile memory and then are downloaded into the volatile built-in registers when power is input.

Once the address region (range) of the word lines and the address region (range) of the bit lines are specified, one rectangular two bit storage region as a region in which specified ranges intersect each other can be specified.

The X address 805 and the Y address 802 are input to the X address comparator 804 and the Y address comparator 803, respectively, and output of the X address comparator 804 is ANDed with output of the Y address comparator 803, and a resultant product is output as a two bit cell region decision signal 801.

The two bit cell region decision signal 801 has a truth value when the X address and the Y address hit on the specified range simultaneously, that is, point to the two bit storage region.

The two bit cell region decision signal 801 dynamically controls outputs of the word line switching circuit 809, the bit line voltage switching circuit 86, the reference current switching circuit 88 and the sense timing switching circuit 89.

In addition, the two bit cell region decision signal 801 is used as a flag indicating that read by inversion in a bit line direction, required for two bit reading, is valid.

When the two bit cell region decision signal 801 is changed from a false value to a truth value, the output of the word line switching circuit 809 is shifted from a voltage for one bit Vwl(1b) to a voltage for two bit Vwl(2b), the output of the bit line voltage switching circuit 86 is shifted from a voltage for one bit Vbit(1b) to a voltage for two bit Vbit(2b), the output of the reference current switching circuit 88 is shifted from a current for one bit Iref(1b) to a current for two bit Iref(2b), the sense timing 800 is delayed, and a linear region bias and a low voltage drain bias of a one bit cell are optimized as a saturated region bias and a high voltage drain bias of a two bit cell.

With this configuration, the one bit and two bit read regions can be simply changed to a rectangular region or a check region, and a single memory array can be used with an optimal condition set depending on required capacity, reliability, speed and power. That is, the single memory array can meet a need for more applications.

Fifth Embodiment

Figure 7:
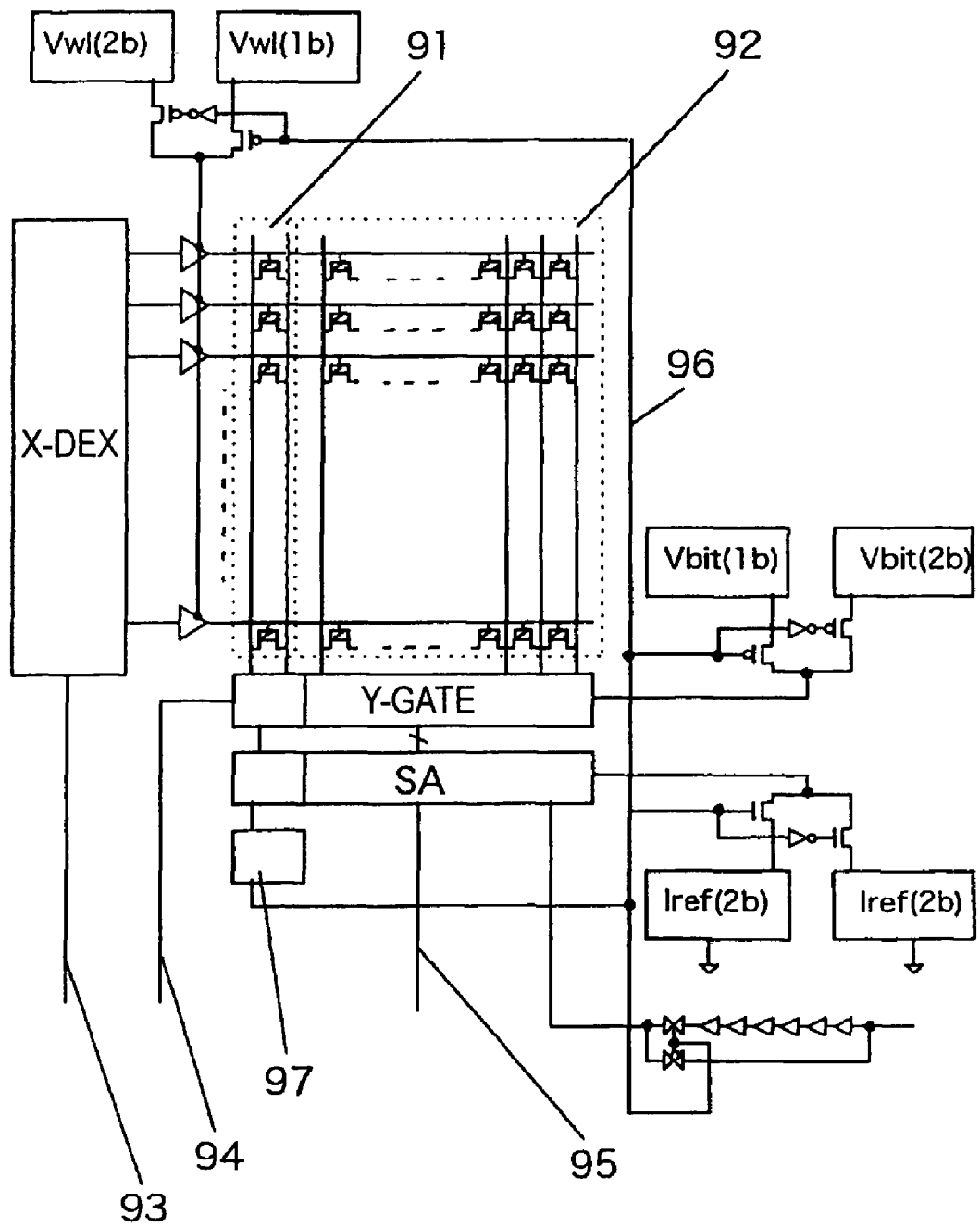
FIG. 7 is a block diagram of a nonvolatile memory having a one bit storage region and a two bit storage region, which can be set in the unit of word line, according to an embodiment of the present invention.

FIG. 7 is a block diagram of a nonvolatile memory having a one bit storage region and a two bit storage region, which can be set in the unit of word line, according to the embodiment of the present invention.

In this embodiment, the X and Y address comparators of the embodiment for the above-described nonvolatile memory are removed, and, instead of, a flag region 91 is formed in the unit of word line and a one bit storage region and a two bit storage region are set in the unit of word line based on information of the flag region.

Data read from a data region 92 of the nonvolatile memory is performed in two phases. First, flag information of the flag region 91 is read as a read condition of the one bit storage region. The read data is stored in a latch 97, and a voltage condition of an array and a parameter of a sense amplifier are changed according to a two bit cell region decision signal 96.

Then, by again accessing the same word line, a desired region is read from a data output 95 as a condition based on a region flag.

With this configuration, by forming the flag region in the unit of word line, the word lines have a one-to-one correspondence with bit storage information, and accordingly, a storage region can easily be decided. In addition, a required configuration is simple. In addition, regarding the access to the same word line, a bias voltage is constant, switching of a word bias is unnecessary, and, once the flag region is read, a subsequent access is made at a speed as high as region fixation. A memory array having a longer word line is more advantageous.

Sixth Embodiment

Figure 8:
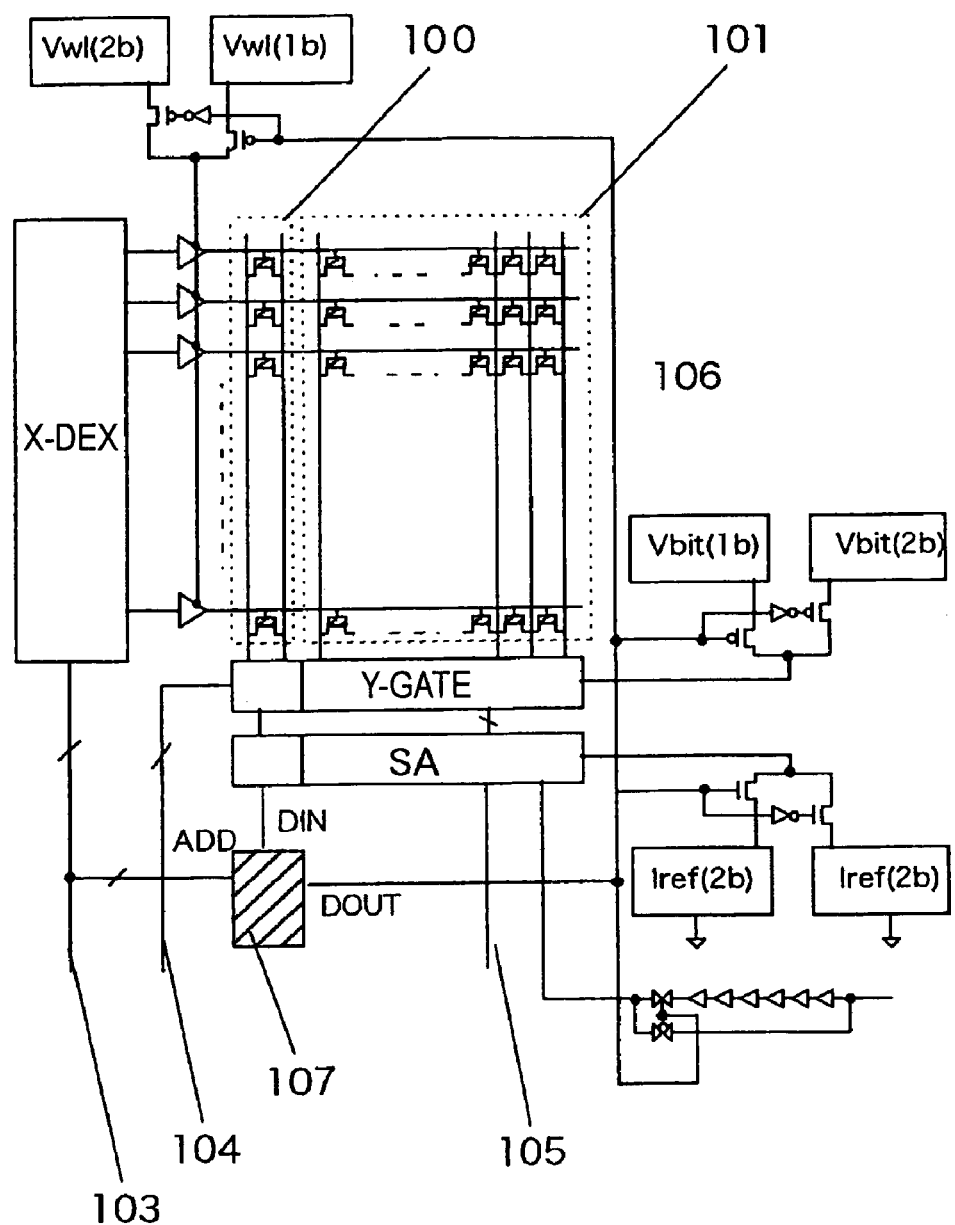
FIG. 8 is a block diagram of a nonvolatile memory having a one bit storage region and a two bit storage region, which can be set in the unit of word line, and having a set information storage function of a RAM, according to an embodiment of the present invention.

FIG. 8 is a block diagram of a nonvolatile memory having a one bit storage region and a two bit storage region, which can be set in the unit of word line, and having a set information storage function of a RAM, according to an embodiment of the present invention. This embodiment is directed to a nonvolatile memory which is capable of increasing an access speed when the word line addresses in the above-described nonvolatile memory of the above embodiment are frequently changed.

Data read from a data region 101 of the nonvolatile memory is performed in two phases. After the nonvolatile memory is powered on, at least trimming information required for set-up of a power source is recorded (that is, voltages of a bit line and a word line are incorrect until data required for adjustment of a reference voltage of a built-in power source are read. The built-in power source first outputs correct values after trimming data are recorded. Then, flag information of a flag region 100 is first read as a read condition of the one bit storage region, and then, the read flag information is written into a RAM 107 (immediately after power up, the RAM has a record mode, i.e., a valid DI. In a normal state, the RAM has a read mode from DO. The read data from the flag region 100 are recorded from a DI bus, with an X address 103 as an address input of the RAM 107.

When the recording is completed, the RAM 107 enters a read mode and information stored in the RAM 107 is read with the X address 103 from the DO as an index. The DO immediately (dynamically) changes the voltage condition of the array and the parameter of the sense amplifier according to the two bit cell region decision signal 92.

In this embodiment, since addresses of the RAM are automatically mapped with addresses of the flag region in a one-to-one correspondence, a hardware configuration for searching such a correspondence is not required.

With this configuration, even if a word line address (X address) is changed to transmit the information of the flag region to a high-speed RAM (for example, a read access speed is several hundred nanoseconds to several microseconds in a volatile memory region and several microseconds in a RAM) after power input, since the flag region is not needed to be read from a nonvolatile memory region, a high speed reading operation can be achieved. In addition, the reading operation is not needed to be performed in two phases, and read of the nonvolatile memory region and read of the RAM can be started simultaneously. (An access to the RAM has only to be completed until the memory array starts to access the word lines and the bit lines actually.)

In addition, since the flag region is formed in the unit of word line, regarding the access to the same word line, a bias voltage is constant, switching of a word bias is unnecessary, and, once the flag region is read, a subsequent access is made at a speed as high as region fixation. A memory array having a longer word line is more advantageous.

In addition, by using the one bit storage region as a region in which power trimming information and so on is first read immediately after power up, data can be read more reliably than data in a typical memory cell even when a power source voltage is yet in an unstable state. Conventionally, such a kind of memory is implemented by using a plurality of bits to decide an output by majority or ECC etc. However, by using the cell configured according to this embodiment, reduction of majority-decision bit numbers or the majority-decision process is unnecessary, thus allowing reduction of an area of the memory and improving reliability of a start-up at the time of power input.

Seventh Embodiment

This embodiment is directed to program and erase states of the one bit memory cells in the virtual ground-typed memory array and arrangement of the memory cells.

Figure 9:
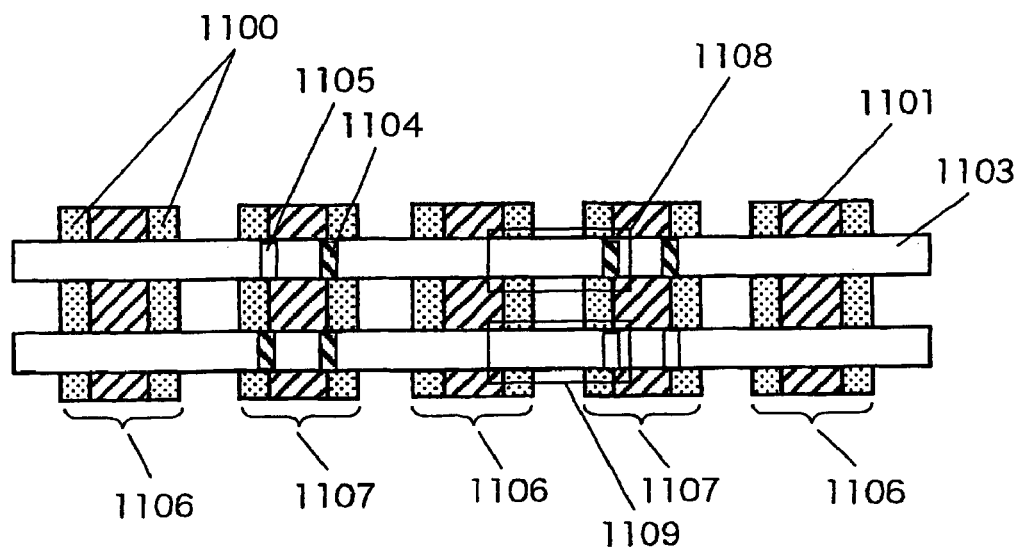
FIGS. 9A and 9B are a layout illustrating a program state of memory cells and arrangement of the memory cells in a virtual ground-typed memory array having a one bit storage region, and an equivalent circuit thereof, respectively, according to an embodiment of the present invention.
Figure 9:
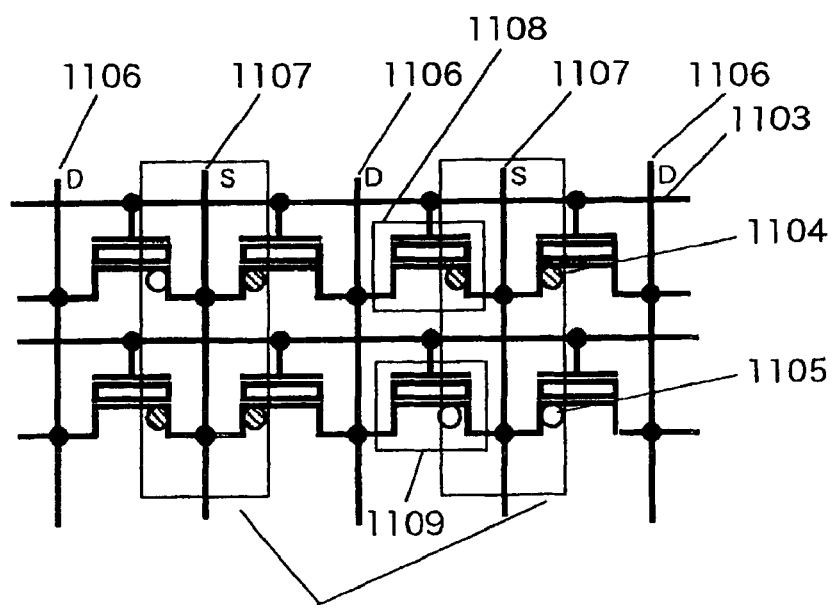

FIG. 9A is a layout illustrating the program state of memory cells and arrangement of the memory cells in the virtual ground-typed memory array having the one bit storage region, according to the embodiment of the present invention. As shown in the figure, each word line 1103 comprises four complete transistors (each having a drain 1106 and a source 1107 aligned) and two partially shown transistors (having only the drain 1106).

Adjacent memory cells are arranged such that a source and a drain (the drain 1107 and the source 1106) defined by a potential at the time of reading are aligned for each diffusion bit line 1100.

A program state 1108 of the memory cell is a state where electrons are injected into only the diffusion bit line 1100 at a source side, and an erase state 1109 is a state where electrons injected into the drain and the source are neutralized or holes are injected. In the figure, in the diffusion bit lines, reference numeral 1105 denotes that injected electrons are not present and reference numeral 1104 denotes that injected electrons are present.

FIG. 9B is an equivalent circuit to clarify an image of the transistor corresponding to FIG. 9A. The injected charges are indicated by a circle in the transistor.

A read bias condition of a cell current may be any one of saturation and non-saturation linear conditions. If a reading operation is performed for a long time under the saturation condition, electrons are injected into the drain by channel hot electrons (this is called a soft write or soft program effect). This soft program effect becomes remarkable as a drain voltage becomes increase. This is a characteristic related to data reliability of a memory cell and is an important parameter in the case of a two bit storage cell. However, in the case of a one bit storage cell, injected electrons at a drain side have little effect on the cell current since a conductive channel is originally pinched-off. While the saturation condition is advantageous in respect of the cell current, the non-saturation condition is preferable in respect of power consumption (when compared with the first embodiment, although there is no effect of low power consumption by reduction of the cell current and spread of a cell current dynamic range, an effect of low power consumption by reduction of the drain voltage can be attained).

With this configuration, the injected electrons to be erased are aligned and arranged at a diffusion bit line side of an adjacent source line side. Hot hole injection aligns adjacent cells at the source side to enable an erase operation. In addition, in this embodiment, since the conventional two-phase erase operation at the drain side and the source side can be performed in one phase of erase from the source side, thus allowing a high-speed erase operation. A drain current required for the erase (a leak current flowing between a diffusion bit line and a silicon substrate due to a current initiated by band-to-band tunneling effect) is two times a current required in the two phase of erase. Typically, in case where supply of current from a built-in voltage-raising power source is cost-ineffective, the current may be supplied from an external power source.

Eighth Embodiment

Figure 10:
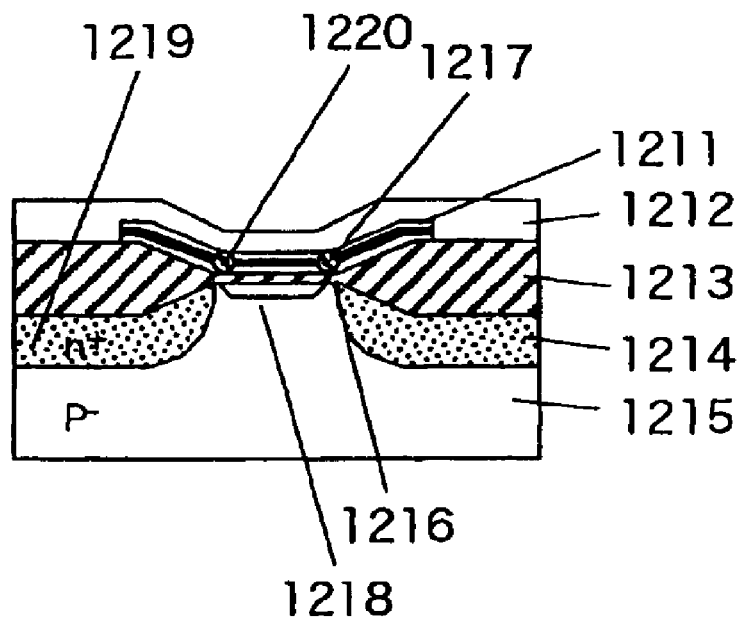
FIGS. 10A and 10B are sectional views of a MONOS-typed memory cell schematically showing injected charges in a driving method of a nonvolatile memory, according to an embodiment of the present invention.
Figure 10:
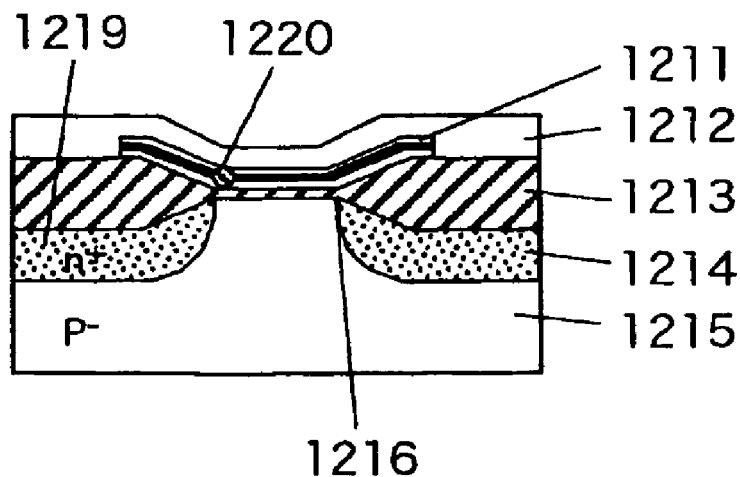

FIGS. 10A and 10B are sectional views of a MONOS-typed memory cell schematically showing injected charges in a driving method of a nonvolatile memory, according to an embodiment of the present invention.

FIG. 10A is a sectional view in the program state. As shown in the figure, as shown in the figure, two LOCOS films 1213 are formed as field oxide films on a P-type silicon substrate 1215. N$^+$ impurity-diffusion bit lines 1214 are formed below the LOCOS films 1213.

A region between drain and source junction edges 1216 becomes a region in which a conductive channel 1218 of a transistor is to be formed. A word line 1212 made of polysilicon or polycide and having an ONO film 1211 as an insulator contacts a channel region.

The word line 1212 having the ONO film 1211 as the insulator acts as a typical transistor.

In a program state, charges for bit information storage 1217 and charges for cell current leak prevention 1220 are locally injected into the ONO film 1211 at a source side and a drain side, respectively, near the drain and source junction edges 1216 of the diffusion bit lines.

The injected charges are hot electrons by a channel current flowing between the diffusion bit lines 1214.

FIG. 10B is a sectional view of the memory cell in an erase state. As shown in the figure, the injected electrons 1217 at the source side are neutralized and erased by injected hot holes. The injected electrons 1220 at the drain side remain unchanged.

Hereinafter, a reading operation will be described. Regardless of the program and erase states, in order to minimize an effect of the injected electrons at the drain side, a cell is required to be biased to a saturated region (also called a non-linear region) for reading, as described earlier (of course, although this cell functions as a memory cell even under a linear condition, this is disadvantageous in respect of speed since a read current at the time of programming is considerably deteriorated).

Accordingly, the cell is read after being biased to have a relation of Vgs>Vth(s) and Vgs>Vth(d)+Vds (where, Vth(s) is a threshold value when viewed from a source 1219, and Vth(d) is a threshold value when viewed from a drain 1214), With this configuration, the injected charges 1220 at the drain side functions as a drain-source forward diode inserted in series between the drain and the source to suppress a cell current which may be generated when the drain and the source of the memory cell are interchanged. Actually, this configuration can realize a structure (almost no increase of an area) even smaller than a structure having a PN junction diode.

A current in the program state has a value of the about same order as the conventional two bit storage memory cell.

Figure 11:
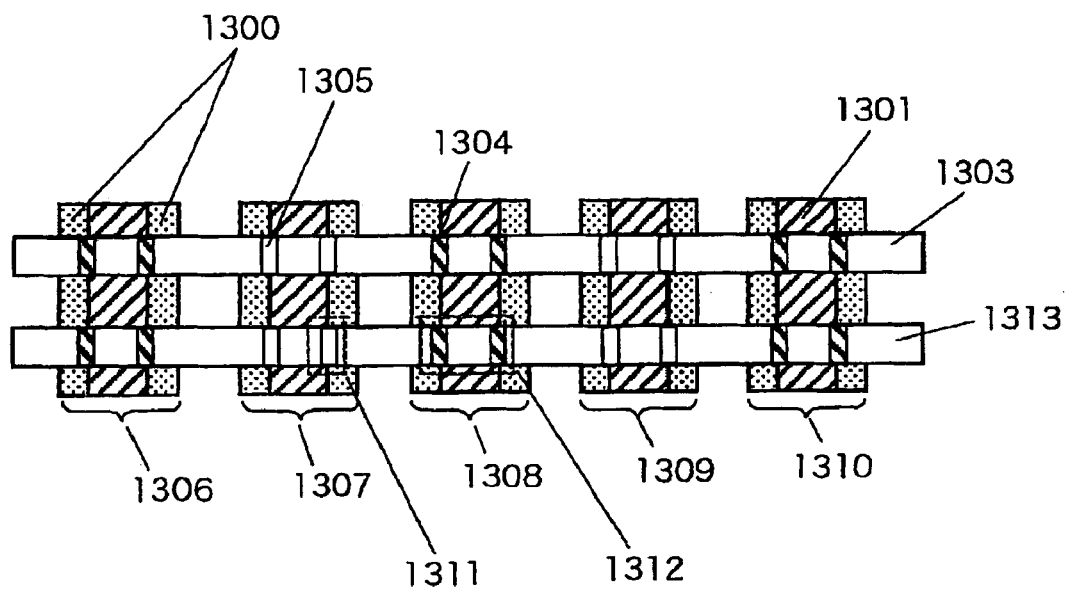
FIGS. 11A and 11B are a layout illustrating a program state of memory cells and arrangement of the memory cells in a virtual ground-typed memory array having a one bit storage region, and an equivalent circuit thereof, respectively, according to an embodiment of the present invention.
Figure 11:
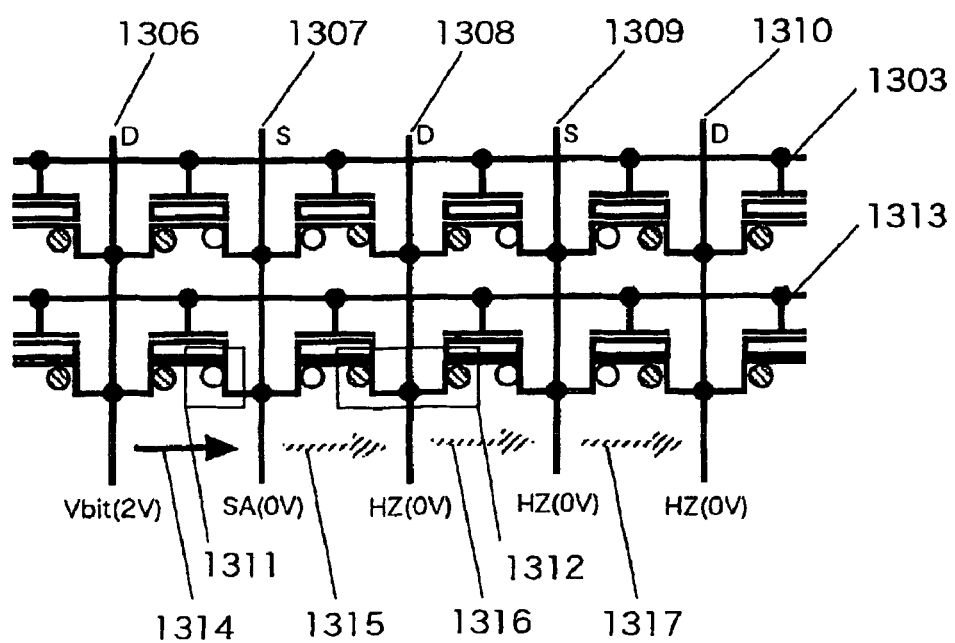

Hereinafter, an embodiment of the present invention using the virtual ground-typed memory array including the one bit MONOS-typed memory cell to which the driving method of the nonvolatile memory described above with reference to FIGS. 10A and 10B and for preventing the cell current from being leaked into adjacent cells at the time of reading will be described with reference to relevant figures. FIG. 11A is a layout illustrating a program state of memory cells and arrangement of the memory cells in the virtual ground-typed memory array having the one bit storage region, according to an embodiment of the present invention. As shown in the figure, each of word lines 1303 and 1313 comprises four complete transistors (each having a drain and a source aligned) and two partially shown transistors (having only the drain).

Adjacent memory cells are arranged such that a source and a drain defined by a potential at the time of reading are aligned for each diffusion bit line.

Fixed injected electrons 1312 are arranged in drains 1306, 1308 and 1310 of an diffusion bit line 1300 of each memory cell, irrespective of the program and erase states. In the program state of the memory cell, a control of injection and erase of electrons in an electron injection position 1305 at a source side is performed according to the above-described hot electron and hot hole injection process. In the figure, electron injection positions 1305 of all cells have no injected electrons and are set as the erase state.

FIG. 11B is an equivalent circuit corresponding to FIG. 11A. The injected charges are indicated by a circle in a transistor. In the figure, a case of reading a bit (presence of the injected electrons) at reference numeral 1311 is considered. A read operation of the cell current in the virtual ground-typed memory array is to discharge embedded bit lines 1306 to 1310 above the cell to a ground potential before selection of a memory cell, as described above, and then to put the embedded bit lines 1306 to 1310 into a high impedance state.

A drain bias voltage Vbit (for example, 2V) is applied to a drain 1306 in order to determine the presence or absence of injected electrons of the bit line 1311, and then, a sense amplifier is connected to a source 1307. When the word line 1314 is selected (the other word line 1303 is not selected), a cell current 1314 flows to raise a potential of the source 1307. With the raising of the potential of the source 1307, the potential of the source 107 becomes higher than that of a drain 1308 of an adjacent bit line to thereby be a potential of the drain 1306. However, a cell current 1315 does not flow due to the injected electrons 1312, and a cell current 1314 is consumed for the raising of the potential of the source 1307.

If there is no injected electrons 1312 at the drain side, the cell currents 1315 and 1317 can flow, and some of the cell current 1314 is leaked into adjacent cells in an order of cell currents 1315, 1316 and 1317. (The leak current is consumed for charging of diffusion bit lines of the adjacent cells.) As a result, the sense amplifier detects a cell current less than an actual cell current.

This phenomenon causes erroneous determination (determining that writing of data into a cell further requiring a program pulse is completed) of a verification operation (measuring a cell current or a threshold value after application of a program pulse, and verifying whether or not further pulses are required) in a cell-program operation. In addition, this phenomenon causes erroneous determination of a verification operation in a cell writing and erase operation, thus making current distribution of a cell wide and smooth.

With this configuration, leakage of the cell current into adjacent bit cells, which is a problem of the virtual ground array, can be prevented, distribution of memory cells can be made steep, and charge state of cells on a memory array can be made constant. Accordingly, reliability can be guaranteed for the memory cells and characteristics of the memory cells can be sufficiently exhibited.

Figure 12:
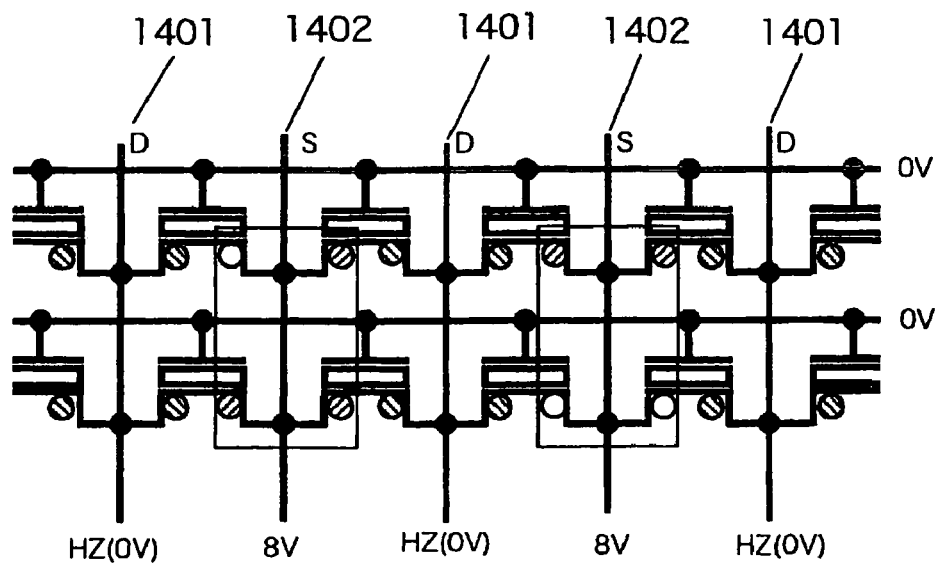
FIG. 12 is an equivalent circuit for explaining an erase operation in a virtual ground-typed memory array having a one bit storage region, according to an embodiment of the present invention.

FIG. 12 is an equivalent circuit for explaining an erase operation in the virtual ground-typed memory array having the one bit storage region, according to an embodiment of the present invention.

With this configuration, the injected electrons to be erased are aligned and arranged at a diffusion bit line 1402 side of an adjacent source line side. Hot hole injection aligns adjacent cells by applying, for example, a voltage of 8V to the source side, releasing the drain side, and setting a word line at a ground potential, to thereby enable an erase operation. In addition, since the conventional two-phase erase operation at the drain side and the source side can be performed in one phase of erase from the source side, thus allowing a high-speed erase operation.

Figure 13:
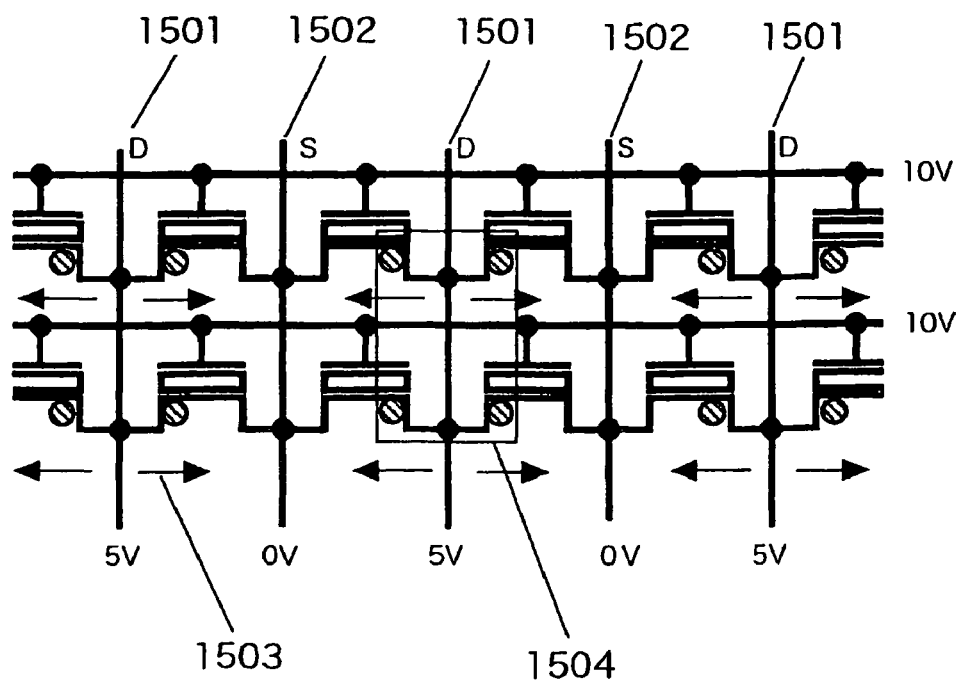
FIG. 13 is an equivalent circuit for explaining an operation of injecting electrons into a drain in a virtual ground-typed memory array having a one bit storage region, according to an embodiment of the present invention.
Figure 14:
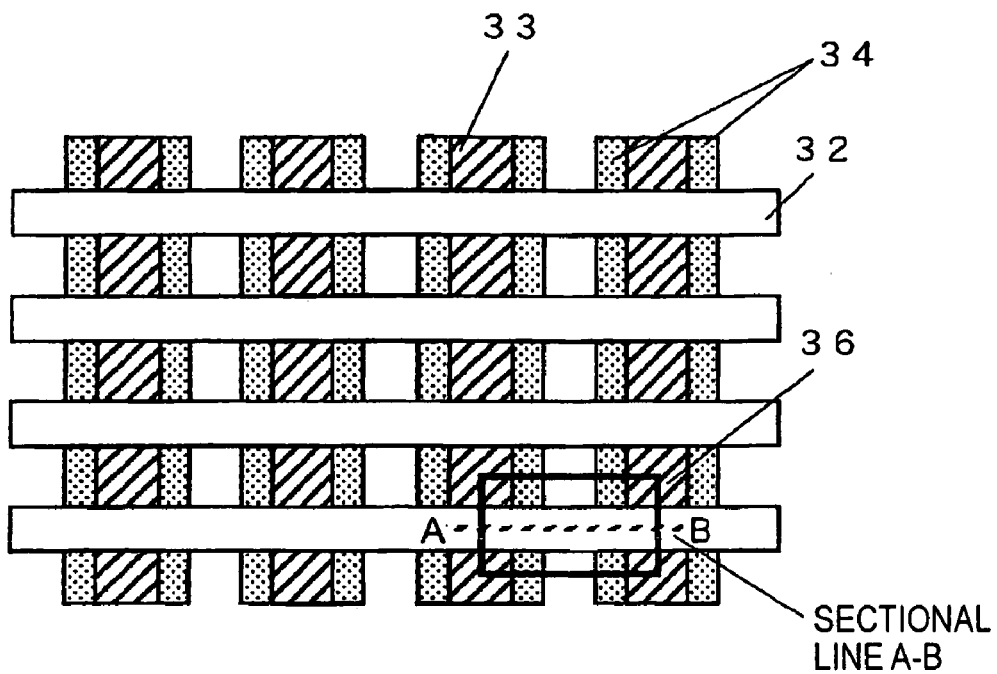
FIGS. 14A and 14B are a plan view and a sectional view of a conventional MONOS-typed memory cell, respectively.
Figure 14:
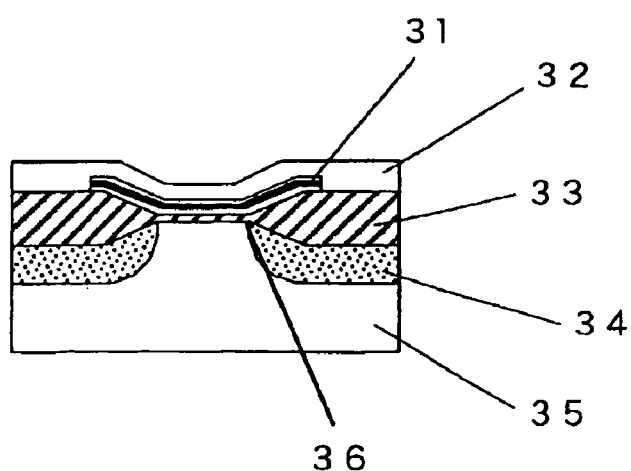
Figure 15:
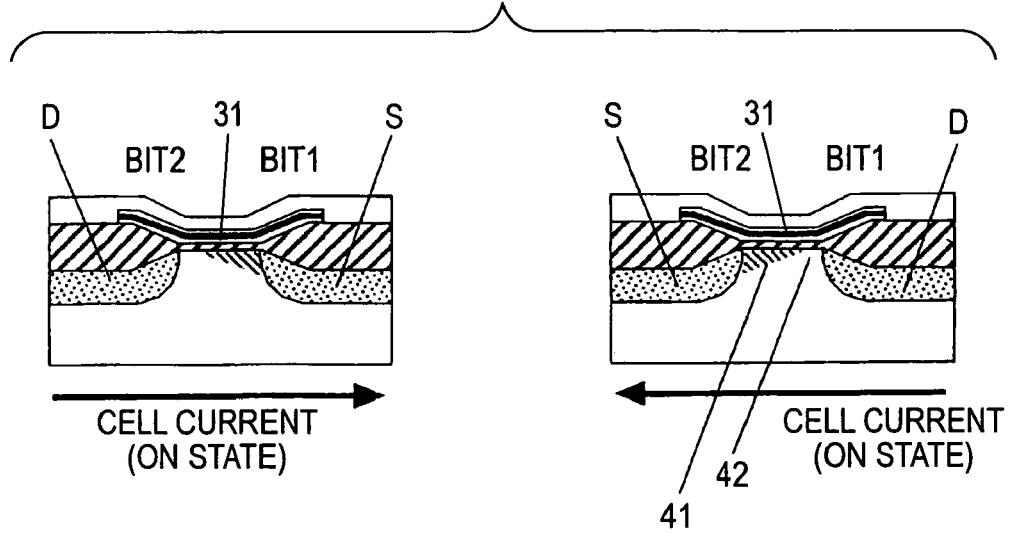
FIGS. 15A and 15B are sectional views for explaining operation of a conventional MONOS-typed memory cell.
Figure 15:
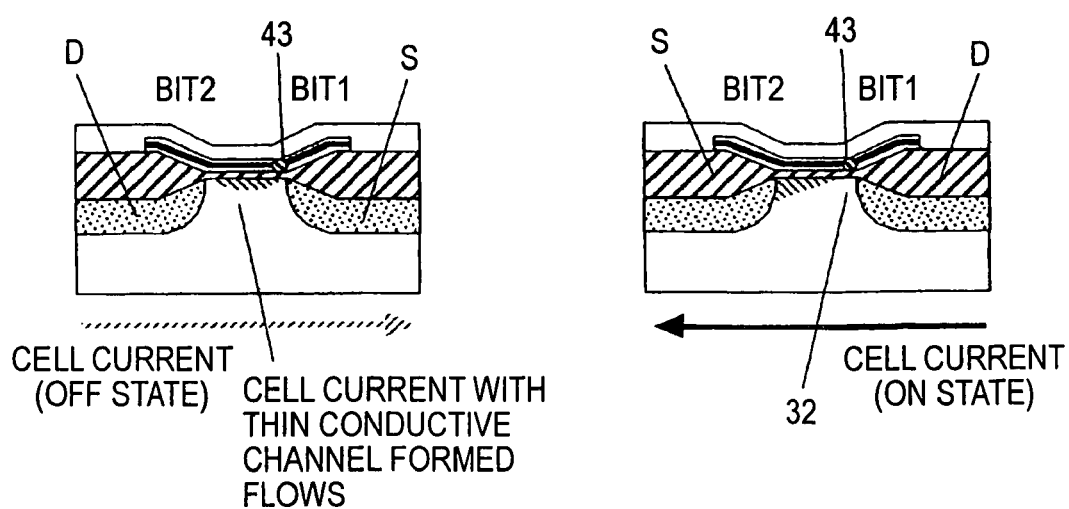

Next, a high-speed programming method of bits at the drain side will be described with reference to FIG. 13. FIG. 13 is an equivalent circuit for explaining an operation of injecting electrons into a drain side in the virtual ground-typed memory array having the one bit storage region, according to an embodiment of the present invention.

Since the injected electrons at the drain side are always fixed charges, a parallel writing is possible. In the figure, by setting a program bias voltage Vpd (for example, 5 V) at a drain 1501 side of an diffusion bit line, a ground potential (0 V) at a source 1502 side, a program bias voltage Vwl (for example, 10 V) at a word line, a writing current 1503 becomes parallel toward adjacent sources from the drain and electrons are injected into the drain in parallel. A degree of parallel depends on supply capacity of the drain current. While a typical writing operation requires selective writing of injected electrons, a writing operation of the present invention is a writing operation for fixed data, thus simplifying a circuit and allowing higher speed writing.

In addition, when the entire surface of an array is divided into several regions and a writing process of bits at the drain side is performed for the divided regions, the same effect can be attained even by controlling the number of drains or word lines to be biased depending on a supply capacity of a drain power source.

The nonvolatile memory of the present invention may be widely used for small communication devices in that high reliability can be achieved with a low current. For example, in connection with a twin program cell system, the nonvolatile memory of the present invention may be widely used for small communication devices such as mobile telephones in that a cell current ratio of the program state to the erase state, that is, a dynamic range of a memory cell current, can be spread, a large margin for a reference current or potential in a read operation can be taken for reading, and accordingly, tolerance to erroneous read due to variation of cell current or change of cell current with time is high and the reading with higher reliability can be realized.

What is claimed is:

1. A driving method of a nonvolatile memory comprising a plurality of MONOS-typed memory cells, each of which is capable of storing two bit information by injecting charges into a local region of an ONO film near a drain or source junction edge;
   wherein a program state of the MONOS-typed memory cells is a state where electrons are injected into two local regions of the ONO film near the drain or source junction edge;
   an erase state is a state where the electrons injected into the two local regions of the ONO film near the drain or source junction edge are neutralized or holes are injected; and
   a read bias is set to be a value for maintaining the MONOS-typed memory cells at a linear region.

2. A nonvolatile memory to which the driving method according to claim 1 is applied, comprising:
   a memory array, including a plurality of MONOS-typed memory cells, each of which is capable of storing two bit information by injecting charges into a local region of an ONO film near a drain or source junction edge;
   wherein the memory array includes a two bit storage cell region in which two bits are stored and a one bit storage cell region in which one bit is stored, each of the two bit and one bit storage cell region being set to a fixed size and a fixed position; and
   the driving method is applied to the one bit storage cell region.

3. A nonvolatile memory to which the driving method according to claim 1 is applied, comprising:
   a memory array including a plurality of MONOS-typed memory cells, each of which is capable of storing two bit information by injecting charges into a local region of an ONO film near a drain or source junction edge;
   wherein the memory array includes a two bit storage cell region in which two bits are stored and a one bit storage cell region in which one bit is stored, each of the two bit and one bit storage cell region being set to any size and any position; and
   the driving method is applied to the one bit storage cell region.

4. A nonvolatile memory to which the driving method according to claim 1 is applied, comprising:
   a memory array including a plurality of MONOS-typed memory cells, each of which is capable of storing two bit information by injecting charges into a local region of an ONO film near a drain or source junction edge;
   wherein a two bit storage cell region in which two bits are stored and a one bit storage cell region in which one bit is stored are mixed in the memory array;
   the driving method is applied to the one bit storage cell region; and
   a read access to the memory array is performed under an access condition where timings of sense amplifiers and values of reference currents are different by distinguishing two bit storage cell region from the one bit storage cell region.

5. A nonvolatile memory to which the driving method according to claim 1 is applied, comprising:
   a memory array including a plurality of MONOS-typed memory cells, each of which is capable of storing two bit information by injecting charges into a local region of an ONO film near a drain or source junction edge;
   wherein a two bit storage cell region in which two bits are stored and a one bit storage cell region in which one bit is stored are variably set in the memory array;
   the driving method is applied to the one bit storage cell region; and the memory array includes a flag region for storing a bit which distinguishes the two bit storage cell region from the one bit storage cell region in the unit of storage cell region.

6. A nonvolatile memory to which the driving method according to claim 1 is applied, comprising:
a memory array including a plurality of MONOS-typed memory cells, each of which is capable of storing two bit information by injecting charges into a local region of an ONO film near a drain or source junction edge;
wherein a two bit storage cell region in which two bits are stored and a one bit storage cell region in which one bit is stored are variably set in the memory array;
the driving method is applied to the one bit storage cell region;
the memory array includes a flag region for storing a bit which distinguishes the two bit storage cell region from the one bit storage cell region in the unit of storage cell region;
the flag region is read in advance into an external register of the memory array as an address corresponding to flag information; and
a read access to the memory array is performed under a different access condition by distinguishing the two bit storage cell region from the one bit storage cell region on the basis of information of the external register.

7. A nonvolatile memory to which the driving method according to claim 1 is applied, comprising:
a memory array including a plurality of MONOS-typed memory cells, each of which is capable of storing two bit information by injecting charges into a local region of an ONO film near a drain or source junction edge;
wherein a two bit storage cell region in which two bits are stored and a one bit storage cell region in which one bit is stored are set in the memory array in the unit of a word line;
the driving method is applied to the one bit storage cell region; and
the memory array includes a flag region for storing a bit which distinguishes the two bit storage cell region from the one bit storage cell region in a bit line direction.

8. A nonvolatile memory to which the driving method according to claim 1 is applied, comprising:
a memory array including a plurality of MONOS-typed memory cells, each of which is capable of storing two bit information by injecting charges into a local region of an ONO film near a drain or source junction edge;
wherein the memory array includes a two bit storage cell region in which two bits are stored and a one bit storage cell region in which one bit is stored;
the driving method is applied to the one bit storage cell region; and
the one bit storage cell region is a high-speed read region having a read timing earlier than a read timing of the two bit storage cell region.

9. A nonvolatile memory to which the driving method according to claim 1 is applied, comprising:
a memory array including a plurality of MONOS-typed memory cells, each of which is capable of storing two bit information by injecting charges into a local region of an ONO film near a drain or source junction edge;
wherein the memory array includes a two bit storage cell region in which two bits are stored and a one bit storage cell region in which one bit is stored;
the driving method is applied to the one bit storage cell region; and
the one bit storage cell region is a region which is first read after power up.

10. A nonvolatile memory to which the driving method according to claim 1 is applied, comprising:
a virtual ground-typed memory array including a plurality of MONOS-typed memory cells, each of which is capable of storing two bit information by injecting charges into a local region of an ONO film near a drain or source junction edge, with drain and source junctions as diffusion bit lines shared with adjacent cells;
wherein a program state of the MONOS-typed memory cells is a state where electrons are injected into only one local region of the ONO film near the source junction edge;
an erase state is a state where electrons injected into local regions of the ONO film near the drain and source junction edges are neutralized or holes are injected;
the diffusion bit lines of the virtual ground-typed memory array are fixed at the drain or the source; and
erasing of the virtual ground-typed memory array is an erasing by hot hole injection from only a source side of the diffusion bit line.

* * * * *